United States Patent [19]

Kitajewski et al.

[11] 4,020,294
[45] Apr. 26, 1977

[54] PRESENCE AND DIRECTION OF LINE CURRENT FLOW DETECTOR

[75] Inventors: Ryszard Kitajewski, Broxbourne; Anthony William Sweet, Stortford; Michael Philip Dyer, Old Harlow, all of England

[73] Assignee: International Standard Electric Corporation, New York, N.Y.

[22] Filed: Mar. 25, 1976

[21] Appl. No.: 670,312

[30] Foreign Application Priority Data

Apr. 1, 1975 United Kingdom ............ 13201/75

[52] U.S. Cl. .................. 179/18 FA; 179/175.3 R; 324/117 H
[51] Int. Cl.² ...................... H04B 3/46; H04M 3/22
[58] Field of Search ............... 179/175.3 R, 18 FA; 324/144, 117 H; 330/6; 340/253 Q

[56] References Cited

UNITED STATES PATENTS

| | | | |
|---|---|---|---|
| 2,550,492 | 4/1951 | Millar | 324/117 H |
| 3,226,640 | 12/1965 | Kuhrt et al. | 324/117 H |
| 3,885,212 | 5/1975 | Herbert | 324/117 H |

Primary Examiner—Douglas W. Olms
Attorney, Agent, or Firm—John T. O'Halloran; Alfred C. Hill

[57] ABSTRACT

A Hall effect device is employed to monitor the presence and direction of line current flow. The output of the Hall effect device is fed to an amplifier having a known output level for a zero input. The output of the amplifier will increase or decrease dependent on the direction of the current flow. The output of the amplifier is monitored for change and direction of change of current flow.

18 Claims, 3 Drawing Figures

PRESENCE AND DIRECTION OF LINE CURRENT FLOW DETECTOR

BACKGROUND OF THE INVENTION

This invention relates to electrical circuits for indicating current flow and direction of current flow in a circuit.

Such circuits are used in automatic telecommunication exchanges for detecting current reversals, which are used for conveying metering indications and also line or junction seizure indications. Hitherto combinations of electromagnetic relays with biassing diodes have been used to perform this function but such arrangements tend to be cumbersome.

SUMMARY OF THE INVENTION

An object of the present invention is to provide improved current direction indicating circuits.

A feature of the present invention is the provision of the combination comprising: a Hall effect device to monitor the presence of and the direction of flow of a current on a conductor, the device having an output signal whose polarity depends on the direction of flow of the current; and a circuit arrangement connected to the device, the arrangement having two output terminals, one of the output terminals providing a logic level 1 and the other of the output terminals providing a logic level 0 when the output signal has one polarity and the other of the output terminals providing a logic level 1 and the one of the output terminals providing a logic level 0 when the output signal has a polarity opposite to the one polarity.

According to the present invention there is provided an electrical circuit for indicating the presence of and direction of flow of a current, in which the current monitored is applied to the energizing winding or windings of a Hall effect device, in which the output of the Hall effect device is connected to the inputs of an amplifier whose parameters are such that its output has a known level when the amplifier input is zero, in which when the current is applied to the energizing winding or windings of the Hall effect device an output is produced by the Hall element whose polarity depends on the direction of flow of the monitored current so that the output level of the amplifier increases or decreases dependent on the direction of flow, and in which the output of the amplifier is connected to two threshold circuits, the first of which gives an output when the amplifier output increases by a predetermined amount while the second threshold circuit gives an output when the amplifier output decreases by a predetermined amount, so that the direction of flow of the monitored current is indicatd by which of the two threshold circuits given an output.

BRIEF DESCRIPTION OF THE DRAWING

Above-mentioned and other features an objects of this invention will become more apparent by reference to the following description taken in conjunction with the accompanying drawing, in which.

DESCRIPTION OF THE PREFERRED EMBODIMENTS

In a Hall effect device as used herein an electrical current to be monitored is applied to the devices energizes winding or windings and produces a magnetic field normal to. the plane of the Hall element. This element is located in an air gap in the magnetic circuit, which may consist of an E-shaped magnetic material core and an I-shaped magnetic material core fitted together to produce a three-legged core with a small air gap in which the Hall element is located. A control current flows across the Hall element and an output voltage is generated across the other dimension of the Hall element. Hence, the output voltage, the control current and the magnetic field are mutually at right angles to each other. The Hall element is a single crystal structure or a deposited thin film of a semiconductor material, preferably with a relatively temperature-independent characteristic. The magnetic circuit may be a soft iron, a modern ferrite or any other suitable magnetic material.

Figure 1:
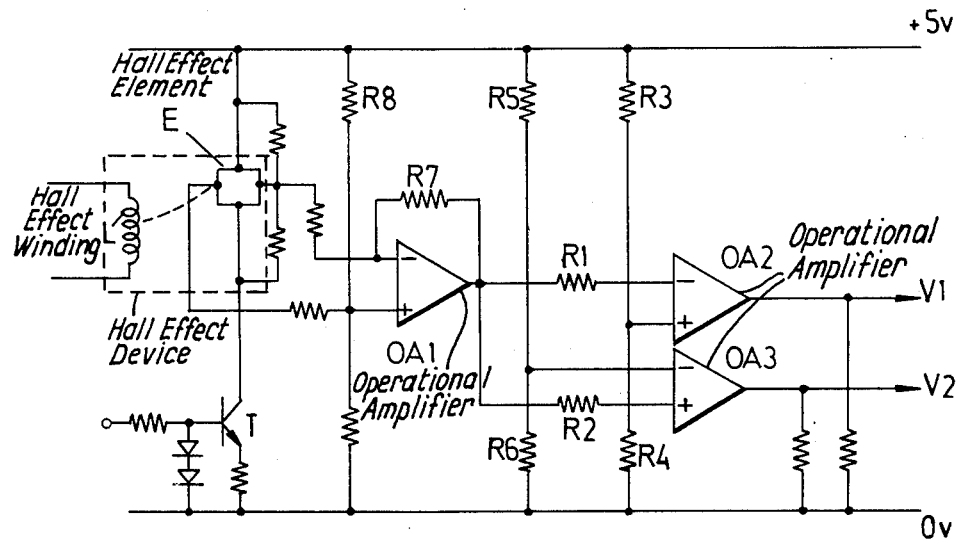
FIG. 1 is a schematic diagram partially in block form of a first embodiment of a circuit for indicating the direction of flow of a monitored current in accordance with the principles of the present invention.

Referring not to FIG. 1, the current to be monitored is applied to the winding L of the Hall effect device, whose element E is connected in series with a transistor T to provide the standing control current for the Hall element. Current flow in this circuit is controlled via an input to the base of the transistor T. The output of the Hall element E is connected via a resistive network to the inputs of an operational amplifier OAI, and the output of amplifier OAI is connected as shown to the inputs of two further operational amplifiers OA2 and OA3 which act as threshold circuits.

In the absence of current in the magnetizing winding L the output connection of OAI stands at +2 volts d.c. (direct current). The resistive network associated with the input to OA1 is so chosen as to improve common mode rejection, otherwise the stage merely acts as an amplifier for the Hall output voltage. The amplified output from OAI is applied via similar resistors R1 and R2 to the minus and positive inputs of amplifiers OA2 and OA3 respectively. The threshold level of amplifier OA2 is set at +1.67 volts by a connection from its positive input to a tap on a potential divider including R3 and R4, and the threshord level of amplifier OA3 is set at +2.39 volts by the potential divider including resistors R5 and R6. Since amplifiers OA2 and OA3 are connected in an opposite manner, both of their outputs are held near ground level, actually at +0.25 volts for the quiescent condition.

If a current is now caused to flow in the winding L, a magnetic flux is generated thereby across the element E, and this in turn generates the Hall output voltage. This is applied to the input of amplifier OA1, and for one direction of current in winding L, the Hall output voltage will be positive-going at the minus input of amplifier OA1. Since amplifier OA1 is an inverting amplifier, its output voltage falls, and if it falls below the threshold of amplifier OA2, the latter conducts to cause its output voltage to rise to +3.0 volts, producing a change in the logic level at V1 from logic level 0 to logic level 1. Amplifier OA3 is driven away from its threshold so that its output remains at the logic level 0, i.e. at 0.25 volts.

If the polarity of the current in winding L reverse, the Hall output voltage reverses its polarity, so that the voltage of amplifier OA1 also reverses. If this output voltage exceeds the threshold of amplifier OA3, the latter conducts to cause its output to rise to +3.0 volts, which changes the logic level at V2 from 0 to 1. At this time amplifier OA2 is driven below its threshold, so its output goes to the logic 0 level, i.e. 0.25 volts. For some sensitive detection functions the minimum current may be less than 16 mA (milliamperes), which would need an increase in the gain of amplifier OA1 so that the circuit can respond to smaller outputs from the Hall element E. This requires an increase in the value of the feedback resistor R7. To compensate for such a change in the quiescent condition of amplifier OA1, the value or R8 must be adjusted. In fact, for each value of resistor R7 there is a different value of resistor R8.

Figure 2:
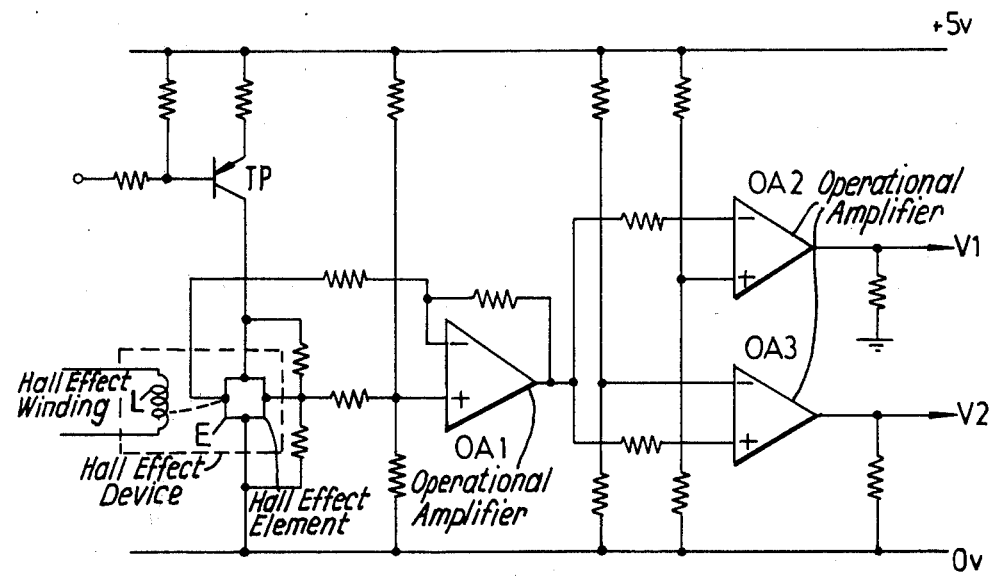
FIG. 2 is a schematic diagram partially in block form of a second embodiment of a circuit for indicating the direction of flow of a monitored current in accordance with the principles of the present invention.

FIG. 2 functions on gnerally similar lines to FIG. 1— hence the use of similar reference characters — but differs in that the first stage which supplies the constant current drive for the Hall element E uses an pnp transistor TP instead of the npn transisitor T used in FIG. 1. This has the advantage that when the circuit is used with TTL logic the TTL zero level is better defined, and variations in the 5v d.c. supply do not produce relative change in the HALL effect d.c. levels as the latter are referenced to ground potential. Also the variations of resistor R8 with resistor R7 are greatly reduced.

Figure 3:
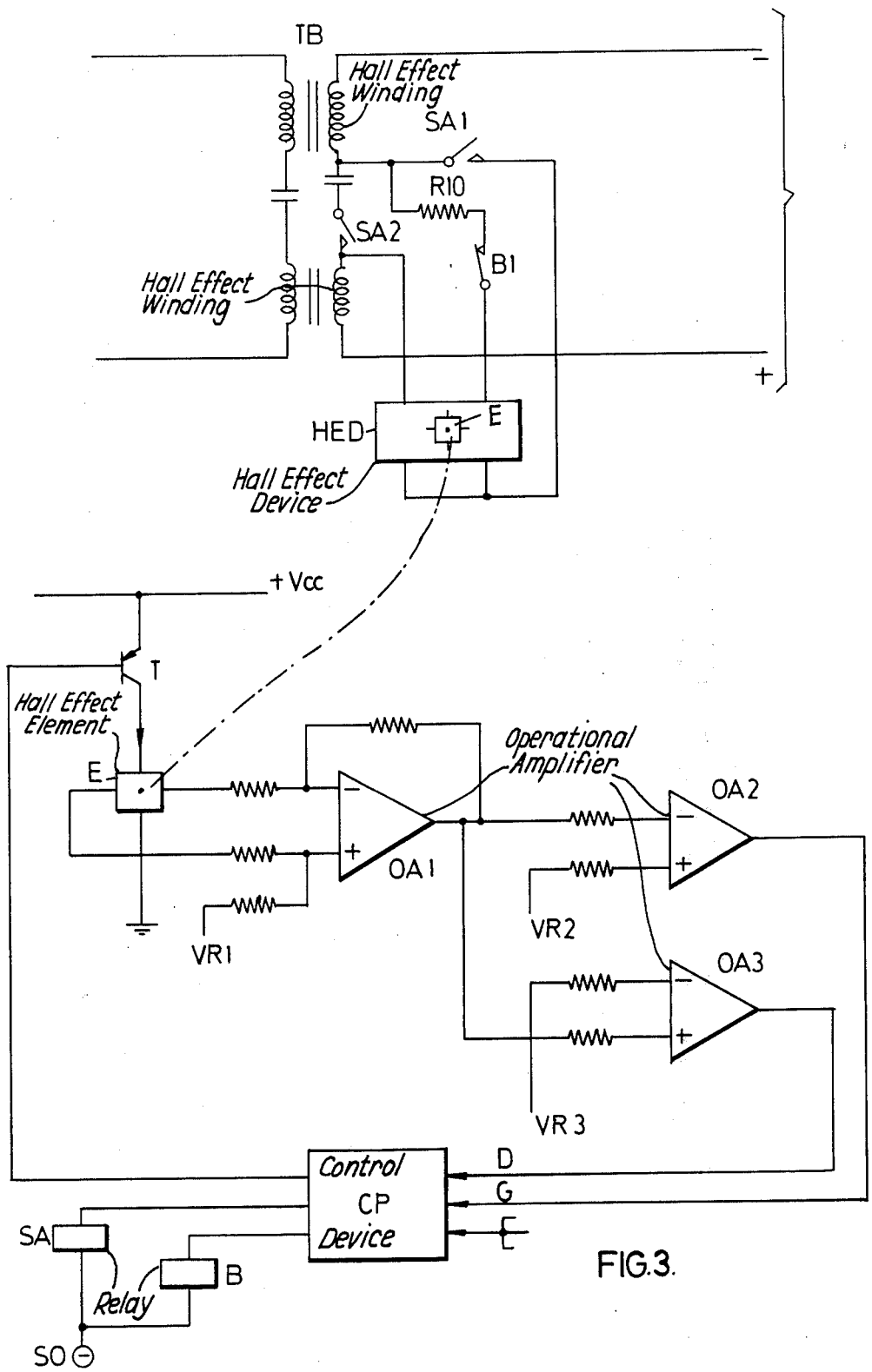
FIG. 3 is a schematic diagram partically in block form of the circuit of FIG. 2 to perform the combined functions of junction supervision and loop detection an an automatic telecommunication exchange.

Referring to FIG. 3, there is illustrated a circuit arrangement generally similar to FIG. 2 used for junction supervision. In this figure Hall effect device is indicated schematically at HED and its element at E. As will be seen from the connections to HED, it has two magnetizing windings.

The function of the junction supervision circuit in a telephone exchange to monitor an outgoing junction of the presence of distant 50 volt 200 + 200 ohm battery feed supplied from the incoming circuit at a distant exchange. It needs a high impedance, typically 10,000 to 15,000 ohms, so that the current drain due to the detector when the junction is idle is below the operating and/or holding threshold of the distant loop detector in the remote incoming circuit. When a call is routed to the outgoing junction circuit via the transmission bridge the junction supervisory detector is disconnected and a low impedance seizure signal or line loop is applied to seize the distant exchange equipment. The answer reversal detector should not respond at this stage since the line potentials retain their normal idle values until the distant answer condition is signalled by a reversal of these potentials. This causes the reversal detector to respond, which must result in backward repetition of the answer signal and the initiation of any necessary metering.

FIG. 3 shows how a circuit basically similar to that of FIG. 2 can be used to meet the functions of the above two detectors. The Hall effect device HED has two windings which are connected to the outgoing junction side of the transmission bridge TB, via a resistor R10, the function of which is to set the total impedance of the detector to the 10,000 – 15,000 ohm range needed for the junction supervisory function.

When the outgoing junction circuit is seized, a control device CP operates relay B. This device CP is a "mini-processor" of the type described in a U.S. copending appliction of A.W. Sweet, Ser. No. 580,274, filed May 23, 1975, having the same assignee as the present application, whose disclosure is incorporated herein by reference. When relay B operates, its contact B1 open to disconnect the high impedance path via R10, and shortly after this, relay SA is operated by control device CP. Relay SA closes its contact SA1 to establish a low impedance current path via one of the windings of the Hall effect device HED, and the establishment of this path causes the distant circuit to be seized. Contace SA2 of relay SA is also closed to complete the circuit of the "outgoing" side of the transmission bridge TB. Control device CP also controls the application of the control current to the Hall element E via the transistor T.

As in the earlier Figures, the electronic circuitry associated with the device HED includes operational amplifiers OA1, OA2 and OA3. Of these amplifier OA1 performs a pure amplification role, with its gain controlled by a feedback resistor on the normal way, while amplifiers OA2 and OA3 are threshold circuits, one for positive-going voltage excursions and the other for negative-going voltage excursion. The outputs of amplifiers OA2 and OA3 are each at logic level 0 if the input voltage is below the threshold and a t locic level 1 if the input voltage is above the threshold. These thresholds are established by reference voltages VR2 and VR3, which correspond to the potential dividers with their taps shown in FIGS. 1 and 2. VRI establishes the quiescent working point for amplifier OA1. Thus, in response to a sampling output from control device CP to transistor T a corresponding positive or negative excursion occurs at the output of amplifier OA1, dpepending on the duration and magnitude of the flux in the magnetic circuit of HED. Note that the control current can be so controlled from control device CP that pulses of control current are applied to the element E via transistor T, thus, economizing in current consumption.

Since the junction supervisory and answer reversal functions need the sensing of currents in opposite senses, sthe output of the positive threshold detector amplifier OA2 is a logic level wich corresponds to the juncton supervisory function and also provides input G to contorl device CP. Similarly, the logic level output of the negative threshold ditector amplifier OA3 corresponds to the answer reversal function and provides input D to control device CP. Device CP relates these detector inputs to the total logical functions of the outgoing junction circuit. Device CP may also validate detector inputs by timing delays, etc.

The difference in sensitivity between the two detector functions is provided by the additional turns on the device HED when two windings are connected in series aiding for the junction supervisory function, as compared with the use of only one winding of answer reversal.

While we have described above the principles of our invention in connection with specific apparatus it is to be clearly understood that this description is made only by way of example and not as a limitation to the scope of our invention as set forth in the objects thereof and in the accompanying claims.

We claim:

1. An electrical circuit for indicationg the presence of and the direction of flow of a current comprising:

a Hall effect device having at least one winding coupled to a conductor upon which said current flows and a Hall element, said Hall element producing a first output signal whose polarity depends on the direction of flow of said current;
  an amplifier coupled to said Hall element, said amplifier having paratmeters that provide a second output signal having a known level when said first output signal is zero, an increasing level when said first output signal has one polarity and a decreasing level when said first output signal has a polarity opposite said one polarity; and
  two threshold circuits coupled to the output of said amplifier, one said threshold cirucits providing a third output signal when said second output signal increases by a first predetermined amount and the other of said threshold cirucits providing a fourth output signal when said second output signal decreases by a second predetermined amount, the direction of flow of said current being determined by which of said threshold circuits provides an output signal.

2. A circuit according to claim 1, further including a series circuit including the emitter-collector path of a transisitor connected across a power supply generating a control current of said Hall element.

3. A circuit according to claim 2, wherein
said transistor is controlled by a pulsed input coupled to its base resulting in a pulsed control current and a pulsed first output signal.

4. A circuit according to claim 1, wherein
said amplifier is a first operational amplifier.

5. A circuit according to claim 4, further including a series circuit including the emmiter-collector path of a transistor connected across a power supply generating a control current for said Hall element.

6. A circuit according to claim 5, wherein
said transistor is controlled by a pulsed input coupled to its base resulting in a pulsed control current and a pulsed first output signal.

7. A circuit according to claim 4, wherein
each of said threshold circuits includes
  a second operational amplifier having one of its inputs coupled to the output of said first operational amplifier and the other of its inputs coupled to a source of reference potential.

8. A circuit according to claim 7, further including a series circuit including the emitter-collector path of a transistor connected across a power supply generating a control current of said Hall element.

9. A circuit according to claim 8, wherein
said transistor is controlled by a pulsed input coupled to its base resulting in a pulsed control current and a pulsed first output signal.

10. A circuit according to claim 1, wherein
each of said threshold circuits includes
  an operational amplifier having one of its inputs coupled to the output of said amplifier and the other of its inputs coupled to a source of reference potential.

11. A circuit according to claim 10, further including a series circuit including the emitter-collector path of a transistor connected across a power supply generating a control current of said Hall element.

12. A circuit according to claim 11, wherein
said transistor is controlled by a pulsed input coupled to its base resulting in a pulsed control current and a pulsed first output signal.

13. An arrangement for providing supervision for a junction circuit outgoing from a telephone exchange, said junction circuit having two wires, comprising:
  a Hall effect device having two windings and a Hall element, said Hall element producing a first output signal whose polarity depends on the direction of current flow in said junction circuit;
  an amplifier coupled to said Hall element, said amplifier having parameters that provide a second output signal having a known level when said first output signal is zero, an increasing level when said first output signal has one polarity and a decreasing level when said first output signal has a polarity opposite said one polairty;
  two threshold cirucits coupled to the output of said amplifier, one of said threshold circuits providing a third output signal when said second output signal increases by a first predetermined amount and the other said threshold circuits providing a fourth output signal when said second output signal decreases by a second predetermined amount, the direction of flow of said current being determined by which of said threshold circuits provides an output signal; and
  a control arrangement coupled to said Hall effect device to connect said two windings to said two wires in an adding relationship for the effect of said current on said Hall effect device so that said threshold circuits respond to the change in line leakage current due to a given one of busying said junction by a remote exchange and a fault developing in siad junction when said junction is idle and to connect only of of said two windings to said junction in response to a seizure of said junction to make an outgoing call with said threshold devices indicating a direction reversal of said current at said remote exchange.

14. The combination comprising:
  a Hall effect device to monitor the presence of and the direction of flow of a current on a conductor, said device having an output signal whose polarity depends on the direction of flow of said current; and
  a circuit arrangement connected to said device, said arrangement having two output terminals, one of said output terminals providing a logic level 1 and the other of said output terminals providing a logic level 0 whe said output signal has one polarity and said other of said output terminals providing a logic level 1 and said one of said output terminals providing a logic level 0 when said output signal has a polarity opposite to said one polarity.

15. The combination according to claim 14, further including when said output signal has polarity opposite to said one polarity.
  a series circuit including the emitter-collector path of a transistor connected across a power supply generating a control current for said Hall effect device.

16. The combination according to claim 15, wherein
said transistor is controlled by a pulsed input coupled to its base resulting in a pulsed control current and a pulsed first output signal.

17. The combination according to claim 14, wherein
said circuit arrangement includes
  an amplifier coupled to said Hall effect device, and
  two threshold circuits coupled to said amplifier, said threshold circuits each providing a different one of said two output terminals.

18. The combination according to claim 17, wherein
each of said amplifier and said threshold circuits is an operational amplifier.

* * * * *